(12) United States Patent
Han

(10) Patent No.: US 11,329,109 B2
(45) Date of Patent: May 10, 2022

(54) DISPLAY PANEL AND DISPLAY DEVICE

(71) Applicant: Shenzhen China Star Optoelectronics Semiconductor Display Technology Co., Ltd., Shenzhen (CN)

(72) Inventor: Zhibin Han, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 366 days.

(21) Appl. No.: 16/627,805

(22) PCT Filed: Dec. 16, 2019

(86) PCT No.: PCT/CN2019/125554
§ 371 (c)(1),
(2) Date: Dec. 31, 2019

(87) PCT Pub. No.: WO2021/109220
PCT Pub. Date: Jun. 10, 2021

(65) Prior Publication Data
US 2021/0367007 A1    Nov. 25, 2021

(30) Foreign Application Priority Data
Dec. 6, 2019  (CN) .......................... 201911238542.1

(51) Int. Cl.
*H01L 27/32*    (2006.01)
*H01L 51/52*    (2006.01)

(52) U.S. Cl.
CPC ...... *H01L 27/3244* (2013.01); *H01L 51/5228* (2013.01)

(58) Field of Classification Search
CPC .......................... H01L 27/3244; H01L 51/5228
See application file for complete search history.

(56) References Cited

U.S. PATENT DOCUMENTS

| 5,187,602 | A | * | 2/1993 | Ikeda | ................ G02F 1/136213 |
| | | | | | 349/39 |
| 2012/0293090 | A1 | | 11/2012 | Yim et al. | |
| 2017/0125505 | A1 | * | 5/2017 | Oh | ...................... H01L 27/3276 |
| 2017/0347424 | A1 | * | 11/2017 | Yan | ........................ H05B 45/60 |
| 2018/0151647 | A1 | | 5/2018 | Lee et al. | |
| 2019/0164998 | A1 | * | 5/2019 | Cho | ..................... H01L 27/1225 |
| 2019/0259967 | A1 | * | 8/2019 | Yang | .................... H01L 27/3258 |
| 2019/0386034 | A1 | * | 12/2019 | Lee | ..................... H01L 27/3246 |
| 2020/0227672 | A1 | | 7/2020 | Liu | |

FOREIGN PATENT DOCUMENTS

| CN | 107394060 | 11/2017 |
| CN | 108933154 | 12/2018 |
| CN | 109817671 | 5/2019 |
| CN | 110120407 | 8/2019 |
| CN | 110098348 | 9/2019 |
| CN | 110299467 | 10/2019 |

\* cited by examiner

*Primary Examiner* — Eugene Lee

(57) ABSTRACT

The present invention provides a display panel and a display device, the display panel has an array substrate, and the array substrate has a substrate, a first inorganic film layer, at least one auxiliary cathode, a second inorganic film layer, and at least one via hole. The via hole is arranged in at least two voltage drop regions that are arranged sequentially. The via hole in each of the voltage drop regions is distributed evenly. A first voltage drop region is disposed opposite to a center or a side edge of the substrate.

11 Claims, 3 Drawing Sheets

DISPLAY PANEL AND DISPLAY DEVICE

RELATED APPLICATIONS

This application is a National Phase of PCT Patent Application No. PCT/CN2019/125554 having International filing date of Dec. 16, 2019, which claims the benefit of priority of Chinese Patent Application No. 201911238542.1 filed on Dec. 6, 2019. The contents of the above applications are all incorporated by reference as if fully set forth herein in their entirety.

FIELD AND BACKGROUND OF THE INVENTION

The present invention relates to a field of display, especially relates to a display panel and a display device.

In large size active matrix organic light emitting diode (AMOLED) display panels, light emission modes are classified into a top emission solution and a bottom emission solution. The top emission has an advantage of a high aperture ratio. For an issue of a shorter lifespan of an OLED device, a high aperture ratio can mitigate deteriorated display due to the short lifespan of the device. However, because the top emission solution requires light emitted from the OLED device to extend through the cathode, a thickness of the cathode is required to be thin to guarantee a light transmittance. Such requirement makes an area resistance of the cathode greatly high. The greater area resistance would make inconsistent voltage drops in different places, which finally affects a current of the OLED device and further influences display uniformity of the display panel.

Most of the solutions are to design an auxiliary electrode to lower the area resistance of the thin cathode. Generally, the used solution is auxiliary cathode holes distributed evenly in the entire surface. Although the solution of evenly distributed auxiliary cathode holes in the entire surface can mitigate a voltage drop, effect discrepancy among voltage drops of different places of the display panel still exists. The entire voltage drop value decreases but display discrepancy among different places is not mitigated.

Because voltage drops (IR drops) in different places of the display panel are inconsistent, an improving method of the conventional technology is only dividing the voltage drops simply in a linear gradient, hole densities of the voltage drop regions linearly vary, and are respectively 100%, 75%, 50%, 25%, 0% from a central point of the display panel to an edge of the display panel. However, although such distribution of linear variation eases the discrepancy of the voltage drops in a certain extent, sudden variation of brightness exists in the transition region with hole density variation, for example the transition regions from the voltage drop of 100% to the voltage drop of 75%, which finally results in a blur bright line appears on the screen to influence display effect of the display panel.

SUMMARY OF THE INVENTION

Technical Issue

An objective of the present invention is to solve the technical issue that in the conventional display panel, the voltage drop is greater and uniformity of displayed brightness of display device is poor.

Technical Solution

To achieve the above objective, the present invention provides a display panel comprising an array substrate, wherein the array substrate comprises: a substrate; a first inorganic film layer disposed on a surface of a side of the substrate; at least one auxiliary cathode disposed on a surface of a side of the first inorganic film layer away from the substrate; a second inorganic film layer disposed on a surface of a side of the auxiliary cathode away from the first inorganic film layer; and at least one via hole defined through the second inorganic film layer, and is disposed opposite to the auxiliary cathode; wherein the at least one via hole is arranged in at least two voltage drop regions that are sequentially arranged, and the at least one via hole of each of the voltage drop regions is distributed evenly; wherein a first voltage drop region is disposed opposite to a center or a side edge of the substrate; wherein a hole density of a $i^{th}$ one of the voltage drop regions is greater than a hole density of a $(i+1)^{th}$ one of the voltage drop regions, and is less than a hole density of a $(i-1)^{th}$ one of the voltage drop regions.

Furthermore, a source input point is disposed on each of four side edges of the substrate.

Furthermore, a formula of a via hole distribution density P(x) of the at least one via hole on the second inorganic film layer is as follows: $P(x)=[(n+x)\times(n-x-1)]/(n^2+n)\times 100\%$; wherein x indicates an $x^{th}$ pixel counted from a central point of the array substrate to an edge of the array substrate; n indicates a pixel number counted from the central point of the array substrate to the edge of the array substrate, and both the x and the n are positive integers.

Furthermore, the via hole distribution density gradually decreases from the central point to the edge; and the via hole distribution density of the central point is greater than the via hole distribution density of the edge.

Furthermore, an outer edge of each of the voltage drop regions surrounds a same enclosure shape, and a center of each of the voltage drop regions is a center point of the substrate.

Furthermore, the via hole distribution density of each of the voltage drop regions is the same.

Furthermore, the substrate is defined with a first side edge and a second side edge that are parallel to each other; the first side edge is disposed with the first voltage drop region; and the second side edge is disposed with a source input point.

Furthermore, a formula of a via hole distribution density P(x) of the at least one via hole on the second inorganic film layer is as follows: $P(x)=[(n+x)\times(n-x-1)]/(n^2+n)\times 100\%$; and x indicates an $x^{th}$ pixel counted from the first side edge of the array substrate to the second side edge of the array substrate; n indicates a pixel number counted from the first side edge of the array substrate to the second side edge of the array substrate, and both the x and the n are positive integers.

Furthermore, each of the voltage drop regions is a rectangle; and in the rectangle, the via hole distribution density of a place with a same distance from the first side edge is the same.

Furthermore, the via hole distribution density of each of the voltage drop regions is the same.

To achieve the above objective, the present invention also provides a display device comprising the above display panel.

Advantages

The technical effect of the present invention is that distribution of the auxiliary cathode and the via hole is non-linear to mitigate discrepancy of brightness between adjacent two of the voltage drop regions and enhance brightness uniformity of the display device.

BRIEF DESCRIPTION OF THE SEVERAL VIEWS OF THE DRAWINGS

Specific embodiments of the present invention are described in details with accompanying drawings as follows to make technical solutions and advantages of the present invention clear.

Figure 1:
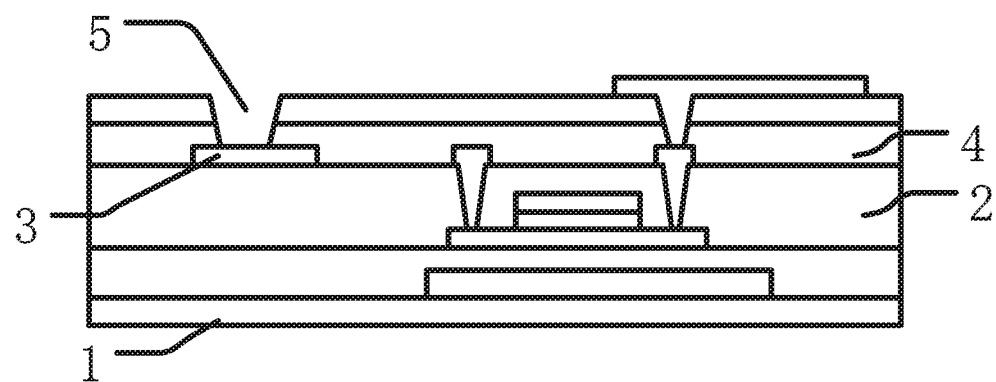
FIG. 1 is a schematic structural view of a display panel of a first or second embodiment of the present invention.

Reference characters are as follows:

1, substrate; 2, first inorganic film layer; 3, auxiliary cathode; 4, second inorganic film layer; 5, via hole; 6, source input point;

10, first voltage drop region; 20, second voltage drop region; 30, third voltage drop region; 40, fourth voltage drop region; 50, fifth voltage drop region.

DESCRIPTION OF SPECIFIC EMBODIMENTS OF THE INVENTION

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

In the description of the present invention, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present invention can be understood on a case-by-case basis.

In the present invention, it should be noted that unless clear rules and limitations otherwise exist, words "a first feature is "on" or "under" a second feature" can include a direct contact of the first and second features, can also include a contact of the first and second features through another feature therebetween instead of a direct contact. Furthermore, words "the first feature is "above" or "over" the second feature include that the first feature is right above or obliquely above the second feature, or only indicate that a level of the first feature is higher that of the second feature. Words "the first feature is "under" or "below" the second feature include that the first feature is right under or obliquely under the second feature, or only indicate that the level of the first feature is lower than that of the second feature.

The following disclosure provides many different embodiments or examples to achieve different structures of the present invention. To simplify the disclosure of the present invention, the components and arrangements of the specific examples are described below. Of course, they are merely examples, and the purpose is not to limit the present invention. Furthermore, the present invention may repeat reference numerals and/or reference letters in different examples. The repetition is for the purpose of simplification and clarity, and does not by itself indicate the relationship between the various embodiments and/or settings discussed. In addition, the present invention provides examples of various specific processes and materials, but a person of ordinary skill in the art can be aware of the application of other processes and/or the use of other materials.

First Embodiment

Figure 2:
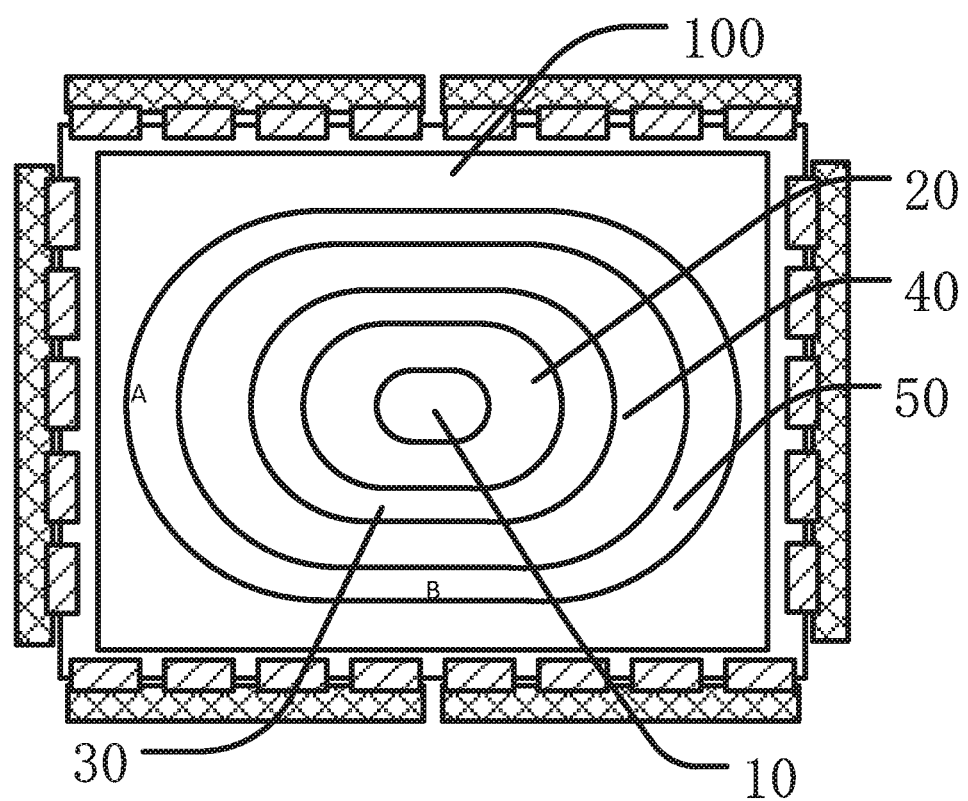
FIG. 2 is a top view of the via hole on the second inorganic film layer of the first embodiment of the present invention.

Specifically, with reference to FIGS. 1 and 2, an embodiment of the present invention provides a display panel and a display device, and the display device comprises the display panel, as shown in FIG. 1. The display panel comprises a substrate 1, a first inorganic film layer 2, an auxiliary cathode 3, a second inorganic film layer 4, and a via hole 5, and further comprises a gate electrode layer, an active layer, and an electrode layer.

The substrate 1 is a glass substrate and performs supporting and underlying functions.

A light shielding layer disposed on an upper surface of the substrate 1 and performs a light shielding function. A material of the light shielding layer is a light shielding material, the light shielding material is metal and comprises: molybdenum (Mo), aluminum (Al), copper (Cu), titanium (Ti), or an alloy thereof.

A buffer layer is disposed on an upper surface of the light shielding layer and the upper surface of the substrate 1 and performs a buffering function. A material of the buffer layer is an inorganic material, the inorganic material comprises silicon oxide or silicon nitride, or a multi-layer structure of oxide and silicon nitride.

The active layer is disposed on an upper surface of the buffer layer, and a material of the active layer is a semiconductor material. The semiconductor material comprises indium gallium zinc oxide (IGZO), indium gallium titanium oxide (IZTO), and indium gallium zinc titanium oxide (IGZTO). The active layer is disposed above the light shielding layer, in other words, the active layer and the light shielding layer are disposed oppositely, and the active layer provides of the display panel with circuit support.

Agate insulation layer is disposed on an upper surface of the active layer, and a material of the gate insulation layer is an inorganic material. The inorganic material comprises silicon oxide or silicon nitride, or a multi-thin film structure. The gate insulation layer and the active layer are disposed oppositely and perform an insulating function to prevent shorting among circuits inside the display panel.

The gate electrode layer is disposed on an upper surface of the gate insulation layer, and a material of the gate electrode layer is a metal material. The metal material comprises molybdenum (Mo), aluminum (Al), copper (Cu), titanium (Ti), or an alloy thereof, or a multi-thin film structure. The gate electrode layer and the gate insulation layer are disposed oppositely.

The first inorganic film layer 2 is disposed on an upper surface of the gate electrode layer, the upper surface of the active layer, and the upper surface of the buffer layer, and a material of the first inorganic film layer 2 is an inorganic material. The inorganic material comprises silicon oxide, silicon nitride, or a multi-thin film structure and performs an insulating function to prevent the circuits from shorting. An insulation layer via hole is defined above the active layer. The insulation layer via hole is defined through first inorganic film layer 2, the insulation layer via hole facilitates electrical connection between the electrode layer and the active layer.

A source and drain layer is disposed on an upper surface of the first inorganic film layer 2, and a material of the source and drain layer comprises a metal material. The metal material comprises molybdenum (Mo), aluminum (Al), copper (Cu), titanium (Ti), or an alloy thereof, or a multi-thin film structure. A portion of the metal material is disposed in the insulation layer via hole, and the source and drain layer is connected to the active layer through the insulation layer via hole to form a circuit connection.

The auxiliary cathode 3 is disposed on the upper surface of the first inorganic film layer 2, and the auxiliary cathode 3 can be connected to the cathode to lower a sheet resistance of the cathode.

The second inorganic film layer 4 is disposed on the upper surface of the first inorganic film layer 2, an upper surface of the source and drain layer, and an upper surface of the auxiliary cathode 3. The second inorganic film layer 4 is a passivation layer, and a material thereof comprises a silicon oxide material to perform an insulating function and a function to block external water oxygen.

A planarization layer is disposed on an upper surface of the second inorganic film layer 4, and the planarization layer planarizes a surface of the film layer to facilitate bonding of a later film layer and prevent separation thereof. A planarization layer via hole is defined in the planarization layer, and the planarization layer via hole and the source and drain layer are disposed oppositely for providing the electrode layer with a channel.

The electrode layer is disposed on an upper surface of the planarization layer, and the electrode layer is a pixel electrode. A material of the electrode layer is an indium tin oxide material filled fully in the planarization layer via hole such that the electrode layer is connected electrically to the source and drain layer for providing light emission of a later light emitting material with circuit support.

The via hole 5 is defined through the planarization layer and the second inorganic film layer 4, and is disposed opposite to the auxiliary cathode 3. In FIG. 1 only one via hole and one auxiliary cathode are illustrated. In a real display panel, multiple sets of the via holes and multiple sets of the auxiliary cathode are distributed between the second inorganic film layer and the first inorganic film layer.

With reference to FIG. 2, in the present embodiment, the display panel are four sides-driven. In other words, a source input point is disposed on each of four side edges of the substrate 1. In the meantime, voltage drop regions are formed, the via holes in each of the voltage drop regions are distributed evenly.

A central point of the substrate 1 is a first voltage drop region 10, and disposed around the central point sequentially outward are voltage drop regions of a number i including a second voltage drop region 20, a third voltage drop region 30, a fourth voltage drop region 40, a fifth voltage drop regions 50, etc. (i is a positive integer greater than or equal to 2). A via hole distribution density of a $i^{th}$ voltage drop region is greater than a via hole distribution density of a $(i+1)^{th}$ voltage drop region, and is less than a via hole distribution density of a $(i-1)^{th}$ voltage drop region.

A formula of a via hole distribution density $P(x)$ of the via hole on the second inorganic film layer is as follows: $P(x)=[(n+x)\times(n-x-1)]/(n^2+n)\times 100\%$; wherein x indicates an $x^{th}$ pixel counted from a central point of the array substrate to an edge of the array substrate; n indicates a pixel number counted from the central point of the array substrate to the edge of the array substrate, and both the x and the n are positive integers.

For example: in a display panel with a ratio of 16:9 and a resolution of 3840×1920, and A and B points are pixel numbers from the central point to the edge, then the values of x of the A and B points are 960 and 480 respectively, n (A)=1920, n (B)=960. It is acquired that P (A)=0.748829≈75%, P (B)=0.747659≈75%. Actually, the A and B points are regions with the same density. Therefore, the A and B points can have an average value, an ellipse-like contour constructed by two semi-circles and a rectangle through the points, and finally an auxiliary cathode hole density in the ellipse-like contour region is 75%. And so forth a gradient distribution of hole contour lines of 0-100% is designed and, a distribution diagram of the auxiliary cathode as shown in FIG. 2 is acquired.

Because the source input points are disposed respectively on the four side edges of the substrate, the voltage drop on the side edge is less, the greater a distance of a place from the side edge, the greater the voltage drop is. Therefore, the via hole distribution density on the central point is greater than the via hole distribution density on the edge, and the via hole distribution density gradually decreases from the central point to the edge.

An outer edge of each of the voltage drop regions surrounds a same enclosure shape that is an ellipse-like shape enclosed by a rectangle and two identical semi-circles. The two semi-circles are disposed respectively on parallel side edges of a set of the rectangle. Arc lines of the semi-circles are connected to side edges of another set of the rectangle. A center of each of the voltage drop regions is the central point of the substrate, and the via hole distribution density in each of the voltage drop regions is the same.

The technical effect of the present invention is that distribution of the auxiliary cathode and the via hole is non-linear to mitigate discrepancy of brightness between adjacent two of the voltage drop regions and enhance brightness uniformity of the display device.

Second Embodiment

Figure 3:
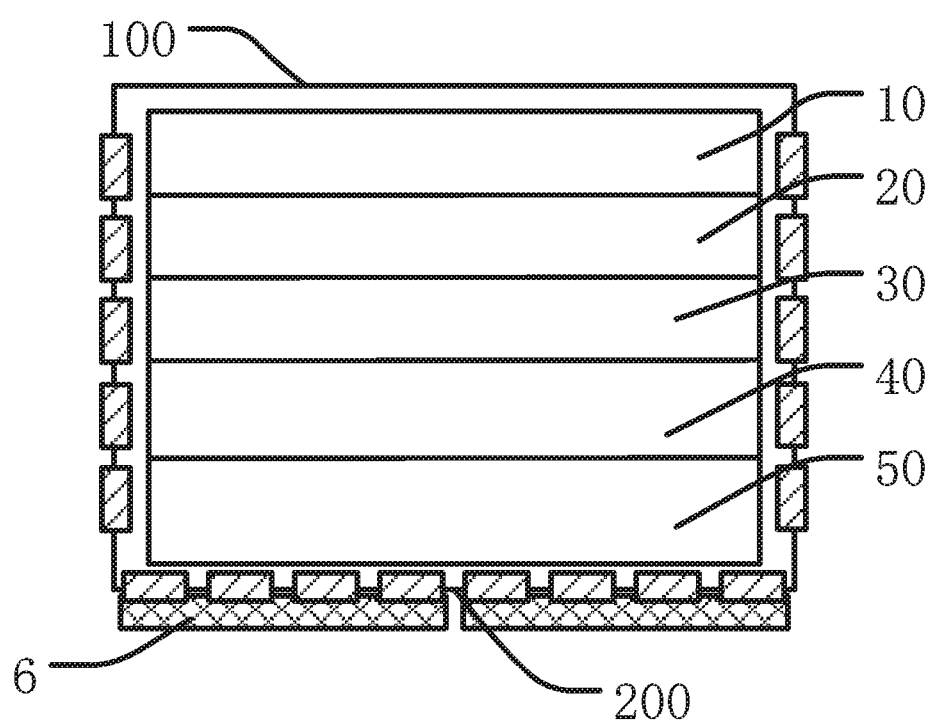
FIG. 3 is a top view of the via hole on the second inorganic film layer of the second embodiment of the present invention.

With reference to FIGS. 1 and 3, the present embodiment provides a display device comprising a display panel. The display panel comprises a substrate 1, a first inorganic film layer 2, an auxiliary cathode 3, a second inorganic film layer 4, and a via hole 5, and further comprises a gate electrode layer, an active layer, an electrode layer, etc.

The substrate 1 is a glass substrate and performs supporting and underlying functions.

A light shielding layer disposed on an upper surface of the substrate 1 and performs a light shielding function. A material of the light shielding layer is a light shielding material, the light shielding material is metal and comprises: molybdenum (Mo), aluminum (Al), copper (Cu), titanium (Ti), or an alloy thereof.

A buffer layer is disposed on an upper surface of the light shielding layer and the upper surface of the substrate 1 and performs a buffering function. A material of the buffer layer is an inorganic material, the inorganic material comprises silicon oxide or silicon nitride, or a multi-layer structure of oxide and silicon nitride.

The active layer is disposed on an upper surface of the buffer layer, and a material of the active layer is a semiconductor material. The semiconductor material comprises indium gallium zinc oxide (IGZO), indium gallium titanium oxide (IZTO), and indium gallium zinc titanium oxide (IGZTO). The active layer is disposed above the light shielding layer, in other words, the active layer and the light shielding layer are disposed oppositely, and the active layer provides of the display panel with circuit support.

A gate insulation layer is disposed on an upper surface of the active layer, and a material of the gate insulation layer is an inorganic material. The inorganic material comprises silicon oxide or silicon nitride, or a multi-thin film structure. The gate insulation layer and the active layer are disposed oppositely and perform an insulating function to prevent shorting among circuits inside the display panel.

The gate electrode layer is disposed on an upper surface of the gate insulation layer, and a material of the gate electrode layer is a metal material. The metal material comprises molybdenum (Mo), aluminum (Al), copper (Cu), titanium (Ti), or an alloy thereof, or a multi-thin film structure. The gate electrode layer and the gate insulation layer are disposed oppositely.

The first inorganic film layer 2 is disposed on an upper surface of the gate electrode layer, the upper surface of the active layer, and the upper surface of the buffer layer, and a material of the first inorganic film layer 2 is an inorganic material. The inorganic material comprises silicon oxide, silicon nitride, or a multi-thin film structure and performs an insulating function to prevent the circuits from shorting. An insulation layer via hole is defined above the active layer. The insulation layer via hole is defined through first inorganic film layer 2, the insulation layer via hole facilitates electrical connection between the electrode layer and the active layer.

A source and drain layer is disposed on an upper surface of the first inorganic film layer 2, and a material of the source and drain layer comprises a metal material. The metal material comprises molybdenum (Mo), aluminum (Al), copper (Cu), titanium (Ti), or an alloy thereof, or a multi-thin film structure. A portion of the metal material is disposed in the insulation layer via hole, and the source and drain layer is connected to the active layer through the insulation layer via hole to form a circuit connection.

The auxiliary cathode 3 is disposed on the upper surface of the first inorganic film layer 2, and the auxiliary cathode 3 can be connected to the cathode to lower a sheet resistance of the cathode.

The second inorganic film layer 4 is disposed on the upper surface of the first inorganic film layer 2, an upper surface of the source and drain layer, and an upper surface of the auxiliary cathode 3. The second inorganic film layer 4 is a passivation layer, and a material there of comprises a silicon oxide material to perform an insulating function and a function to block external water oxygen.

A planarization layer is disposed on an upper surface of the second inorganic film layer 4, and the planarization layer planarizes a surface of the film layer to facilitate bonding of a later film layer and prevent separation thereof. A planarization layer via hole is defined in the planarization layer, and the planarization layer via hole and the source and drain layer are disposed oppositely for providing the electrode layer with a channel.

The electrode layer is disposed on an upper surface of the planarization layer, and the electrode layer is a pixel electrode. A material of the electrode layer is an indium tin oxide material filled fully in the planarization layer via hole such that the electrode layer is connected electrically to the source and drain layer for providing light emission of a later light emitting material with circuit support.

The via hole 5 is defined through the planarization layer and the second inorganic film layer 4, and is disposed opposite to the auxiliary cathode 3. In FIG. 1 only one via hole and one auxiliary cathode are illustrated. In a real display panel, multiple sets of the via holes and multiple sets of the auxiliary cathode are distributed between the second inorganic film layer and the first inorganic film layer.

With reference to FIG. 3, in the present embodiment, the display panel is single side-driven. In other words, only one side edge of the substrate 1 is disposed with a source input point. In the present embodiment, the side edge disposed with the source input point is defined as a second side edge 200, and first side edge 100 is parallel thereto. In the meantime, voltage drop regions are formed, and the via holes in each of the voltage drop regions are distributed evenly.

The first side edge 100 is a first voltage drop region 10, and disposed sequentially from the first side edge 100 to the second side edge 200 are voltage drop regions of a number i including a second voltage drop region 20, a third voltage drop regions 30, a fourth voltage drop regions 40, a fifth voltage drop regions 50, etc. (i is a positive integer greater than or equal to 2). A via hole distribution density of a $i^{th}$ voltage drop region is greater than a via hole distribution density of a $(i+1)^{th}$ voltage drop region, and is less than a via hole distribution density of a $(i-1)^{th}$ voltage drop region.

A formula of a via hole distribution density P(x) of the via hole on the second inorganic film layer is as follows: $P(x)=[(n+x)\times(n-x-1)]/(n^2+n)\times100\%$; wherein x indicates an $x^{th}$ pixel counted from the first side edge 100 of the array substrate to the second side edge 200 of the array substrate; n indicates a pixel number counted from the first side edge 100 of the array substrate to the second side edge 200 of the array substrate, and both the x and the n are positive integers.

Because the source input point is disposed on the second side edge 200 of the substrate, the voltage drop on the second side edge 200 is less, the greater a distance of a place from the second side edge 200, the greater the voltage drop is. Therefore, the via hole distribution density on the second side edge 200 is greater than the via hole distribution density on the first side edge 100, and the via hole distribution density gradually decreases from the second side edge 200 to the first side edge 100.

An outer edge of each of the voltage drop regions surrounds a same enclosure shape, which is a rectangle. The via hole distribution density of a place with a same distance from the first side edge 100 is the same.

The technical effect of the present invention is that distribution of the auxiliary cathode and the via hole is non-linear to mitigate discrepancy of brightness between adjacent two of the voltage drop regions and enhance brightness uniformity of the display device.

In the above-mentioned embodiments, the descriptions of the various embodiments are focused. For the details of the embodiments not described, reference may be made to the related descriptions of the other embodiments.

The display panel and the display device provided by the embodiments of the present invention are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A display panel, comprising an array substrate, wherein the array substrate comprises:
   a substrate;
   a first inorganic film layer disposed on a surface of a side of the substrate;
   at least one auxiliary cathode disposed on a surface of a side of the first inorganic film layer away from the substrate;
   a second inorganic film layer disposed on a surface of a side of the auxiliary cathode away from the first inorganic film layer; and
   at least one via hole defined through the second inorganic film layer, and is disposed opposite to the auxiliary cathode;
   wherein the at least one via hole is arranged in at least two voltage drop regions that are sequentially arranged, and the at least one via hole of each of the voltage drop regions is distributed evenly;
   wherein a first voltage drop region is disposed opposite to a center or a side edge of the substrate;
   wherein a hole density of a $i^{th}$ one of the voltage drop regions is greater than a hole density of a $(i+1)^{th}$ one of the voltage drop regions, and is less than a hole density of a $(i-1)^{th}$ one of the voltage drop regions.

2. The display panel as claimed in claim 1, wherein a source input point is disposed on each of four side edges of the substrate.

3. The display panel as claimed in claim 2, wherein a formula of a via hole distribution density P(x) of the at least one via hole on the second inorganic film layer is as follows:

$$P(x)=[(n+x)\times(n-x-1)]/(n^2+n)\times 100\%;$$

wherein x indicates an $x^{th}$ pixel counted from a central point of the array substrate to an edge of the array substrate; n indicates a pixel number counted from the central point of the array substrate to the edge of the array substrate, and both the x and the n are positive integers.

4. The display panel as claimed in claim 2, wherein the via hole distribution density gradually decreases from the central point to the edge; and
the via hole distribution density of the central point is greater than the via hole distribution density of the edge.

5. The display panel as claimed in claim 2, wherein an outer edge of each of the voltage drop regions surrounds a same enclosure shape, and a center of each of the voltage drop regions is a center point of the substrate.

6. The display panel as claimed in claim 3, wherein the via hole distribution density of each of the voltage drop regions is the same.

7. The display panel as claimed in claim 1, wherein the substrate is defined with a first side edge and a second side edge that are parallel to each other;
the first side edge is disposed with the first voltage drop region; and
the second side edge is disposed with a source input point.

8. The display panel as claimed in claim 7, wherein a formula of a via hole distribution density P(x) of the at least one via hole on the second inorganic film layer is as follows:

$$P(x)=[(n+x)\times(n-x-1)]/(n^2+n)\times 100\%;\ \text{and}$$

x indicates an $x^{th}$ pixel counted from the first side edge of the array substrate to the second side edge of the array substrate; n indicates a pixel number counted from the first side edge of the array substrate to the second side edge of the array substrate, and both the x and the n are positive integers.

9. The display panel as claimed in claim 7, wherein each of the voltage drop regions is a rectangle; and
in the rectangle, the via hole distribution density of a place with a same distance from the first side edge is the same.

10. The display panel as claimed in claim 8, wherein the via hole distribution density of each of the voltage drop regions is the same.

11. A display device, comprising the display panel as claimed in claim 1.

* * * * *